(12) United States Patent
Nystrom et al.

(10) Patent No.: US 7,082,291 B2
(45) Date of Patent: Jul. 25, 2006

(54) AUTOMATIC GAIN CONTROL

(75) Inventors: Christian Nystrom, Sollentuna (SE); Per Konradsson, Jarfalla (SE); Ari Grasbeck, Solna (SE)

(73) Assignee: National Semiconductor Corporation, Santa Clara, CA (US)

( * ) Notice: Subject to any disclaimer, the term of this patent is extended or adjusted under 35 U.S.C. 154(b) by 765 days.

(21) Appl. No.: 10/076,992

(22) Filed: Feb. 15, 2002

(65) Prior Publication Data

US 2003/0148745 A1 Aug. 7, 2003

(30) Foreign Application Priority Data

Feb. 16, 2001 (SE) .............................. 0100528

(51) Int. Cl.
*H04B 7/00* (2006.01)

(52) U.S. Cl. ................. 455/242.2; 455/138; 455/250.1; 375/345

(58) Field of Classification Search ................. 455/138, 455/136, 232.1, 234.1, 242.1, 242.2, 250.1; 375/345
See application file for complete search history.

(56) References Cited

U.S. PATENT DOCUMENTS

| | | | | | |
|---|---|---|---|---|---|
| 5,499,392 | A | * | 3/1996 | Grunwell | 455/260 |
| 5,550,869 | A | * | 8/1996 | Gurantz et al. | 375/340 |
| 6,442,380 | B1 | * | 8/2002 | Mohindra | 455/234.1 |
| 6,456,833 | B1 | * | 9/2002 | Sessink | 455/212 |
| 6,459,458 | B1 | * | 10/2002 | Balaban | 375/345 |
| 6,459,889 | B1 | * | 10/2002 | Ruelke | 455/296 |
| 6,549,763 | B1 | * | 4/2003 | Imai et al. | 455/249.1 |
| 6,700,921 | B1 | * | 3/2004 | Shibuta | 375/141 |

* cited by examiner

*Primary Examiner*—Nguyen T. Vo
*Assistant Examiner*—Nhan T Le

(57) ABSTRACT

A method for controlling gain of an amplifier includes amplifying one or more received signals to produce one or more amplified signals. The method also includes generating a plurality of down converted signals using the one or more amplified signals. The method further includes amplifying the plurality of down converted signals based on a gain control signal. In addition, the method includes varying a time constant of the gain control signal based on a time derivative parameter associated with the plurality of down converted signals.

41 Claims, 2 Drawing Sheets

AUTOMATIC GAIN CONTROL

THE BACKGROUND OF THE INVENTION AND PRIOR ART

The present invention relates generally to automatic gain control in a radio frequency receiver. More particularly the invention relates to a method of controlling gain of an amplifier for received radio signals in a radio receiver, according to the preamble of claim 1. The invention also relates to a computer program, for instance in the form of a digital processor algorithm, according to claim 12, a computer readable medium according to claim 13 and an arrangement according to the preamble of claim 14.

A problem that arises in most radio communications receivers concerns the wide variation in power level of the radio signals received at the antenna. This variation is due to a variety of causes. For example, the distance between the transmitter and the receiver can vary considerably. Different transmitters may also utilise different power levels. Since, disregarding the influence of any screening objects, the received signal power decreases as the square of the distance to the transmitter, wide variations in received power level are likely to arise in many situations. Furthermore, these variations may occur very rapidly due to changes in the radio conditions. Movements of the receiver station and/or transmitter station or repositioning of objects between the stations are typical situations in which the conditions for the radio channel can change dramatically.

In radio design it is therefore common practice to include an automatic gain control (AGC) circuit in the receiver. The AGC circuit utilises feedback to maintain a fixed (or at least as stable as possible) signal power level within the receiver even though the signal level at the antenna varies widely. The AGC is achieved by using an amplifier whose gain can be controlled by an external signal, e.g. a voltage or a current.

In analogue receivers it is known to incorporate AGC circuits that operate on a down converted intermediate frequency (IF) signal, i.e. a signal component, which has been frequency transformed down from a received radio frequency (RF) signal and which is to be further frequency transformed down in a following frequency down conversion step.

Receivers in which the radio signal is digitally processed, in most cases after frequency down conversion, usually perform the AGC operation by digitally assisted processing. Thus, the AGC loop implies both analogue to digital conversion and digital to analogue conversion. For many of today's applications this gives a satisfying compensation for the power level variations in the received radio signals.

However, besides capable A/D- and D/A-converters, digital AGC also requires an amount of processing power, which in turn is correlated with power consumption and costs. For large signal bandwidths this effect becomes especially pronounced. Moreover, a large bandwidth places relatively demanding requirements on the A/D- and D/A-converters, particularly if a high digital resolution is necessary.

In a radio communication system for so-called bursty communication, for instance in the form of data packets, short pieces of information are passed between transmitter stations and receiver stations at irregular and generally unpredictable time instances. A particular station can, in most such systems, act both as a transmitter station and as a receiver station. With some exceptions, this means that every station in the system is a potential receiver of a radio message at any time. The station must therefore be capable of tuning its AGC circuit to received radio signals very rapidly.

The IEEE: 802.11a, 802.11b and ETSI: Hiperlan/2 constitute specific examples of wireless LAN protocols where extremely quick and accurate AGC-tuning is demanded. (IEEE=The Institute of Electrical and Electronics Engineers, ETSI=The European Telecommunications Standards Institute, LAN=Local Area Network, Hiperlan=High performance radio local area network). 802.11b specifies packet data exchange at speeds up to 11 Mbps/channel (under direct sequence modulation at 2.4 GHz) and Hiperlan/2 makes possible wireless access to the Internet and real time video services at speeds of 54 Mbps (at 5 GHz). In order to meet the hardest requirements of these standards a radio receiver must be capable of calibrating its receiver circuitry to the power level of received radio signals within 10 μs from start of transmission. This means that the AGC function must control the receiver amplifier gain to a suitable level within 10 μs or less.

However, it is both technically complicated and expensive to accomplish an AGC function involving digital signal level detection with sufficient accuracy and within such short time limits by utilising today's A/D converters, D/A converters and digital signal processors.

SUMMARY OF THE INVENTION

It is therefore an object of the present invention to solve the problems above and thus provide an improved solution for controlling the gain of an analogue variable gain amplifier in a radio receiver, which is quick and accurate enough to meet the requirements of the modern packet data protocols.

According to one aspect of the invention the object is achieved by a method for controlling gain of an amplifier for received radio signals in a radio receiver as initially described, which is characterised by varying a time constant of an automatic gain control signal in response to a time derivative parameter of the at least one down converted signal. The time constant is at least varied such that the automatic gain control signal is adapted to a power variation rate of the received radio frequency signals. The time constant may, of course, also be varied on basis of arbitrary additional parameters depending on, for instance, the protocol and frame structure according to which the particular receiver operates.

According to another aspect of the invention these objects are achieved by a computer program directly loadable into the internal memory of a digital computer, comprising software for controlling the method described in the above paragraph when said program is run on a computer.

According to yet another aspect of the invention these objects are achieved by a computer readable medium, having a program recorded thereon, where the program is to make a computer perform the method described in the penultimate paragraph above.

According to an additional aspect of the invention the object is achieved by an arrangement for controlling gain of an amplifier for received radio signals in a radio receiver as initially described, which is characterised in that a gain control signal generator is adapted for varying a time constant of the automatic gain control signal in response to a time derivative parameter of at least one down converted signal. The variation of the time constant is thus adjusted to a power variation rate of the received radio frequency signals.

The invention thereby provides a very fast, flexible and reliable AGC, which places moderate demands both on the analogue and the digital components. As a consequence, the solution may be realised at a comparatively low cost. The power consumption also becomes reasonable.

Moreover, the solution is scalable with respect to frequency range and power level, such that it may be applied to many technologies in addition to the packet data protocols mentioned. Hence, the invention is also applicable to known TDMA- and CDMA-standards for public mobile data communication, such as GSM, EDGE, GPRS, IS-95B, IS-136, cdma2000, W-CDMA and IMT-2000. (TDMA= Time Division Multiple Access, CDMA=Code Division Multiple Access, GSM=Global System for Mobile Communication, EDGE=enhanced data rate for GSM Evolution, GPRS=General Packet Radio Service in GSM, IS-95B: a packet mode version of the direct sequence CDMA-standard IS-95 used in North America, IS-136: a TDMA cellular system standard predominantly used in North America, cdma2000: a proposed standard in the USA for the next generation of public mobile communication, WCDMA=Wideband CDMA, IMT-2000: harmonisation initiative in International Mobile Telecommunications in 2000 between USA, Europe and Asia under the Radiocommunication Standardization Sector of the International Telecommunication Union (ITU-R)).

BRIEF DESCRIPTION OF THE DRAWINGS

The present invention is now to be explained more closely by means of preferred embodiments, which are disclosed as examples, and with reference to the attached drawings.

DESCRIPTION OF PREFERRED EMBODIMENTS OF THE INVENTION

Figure 1:
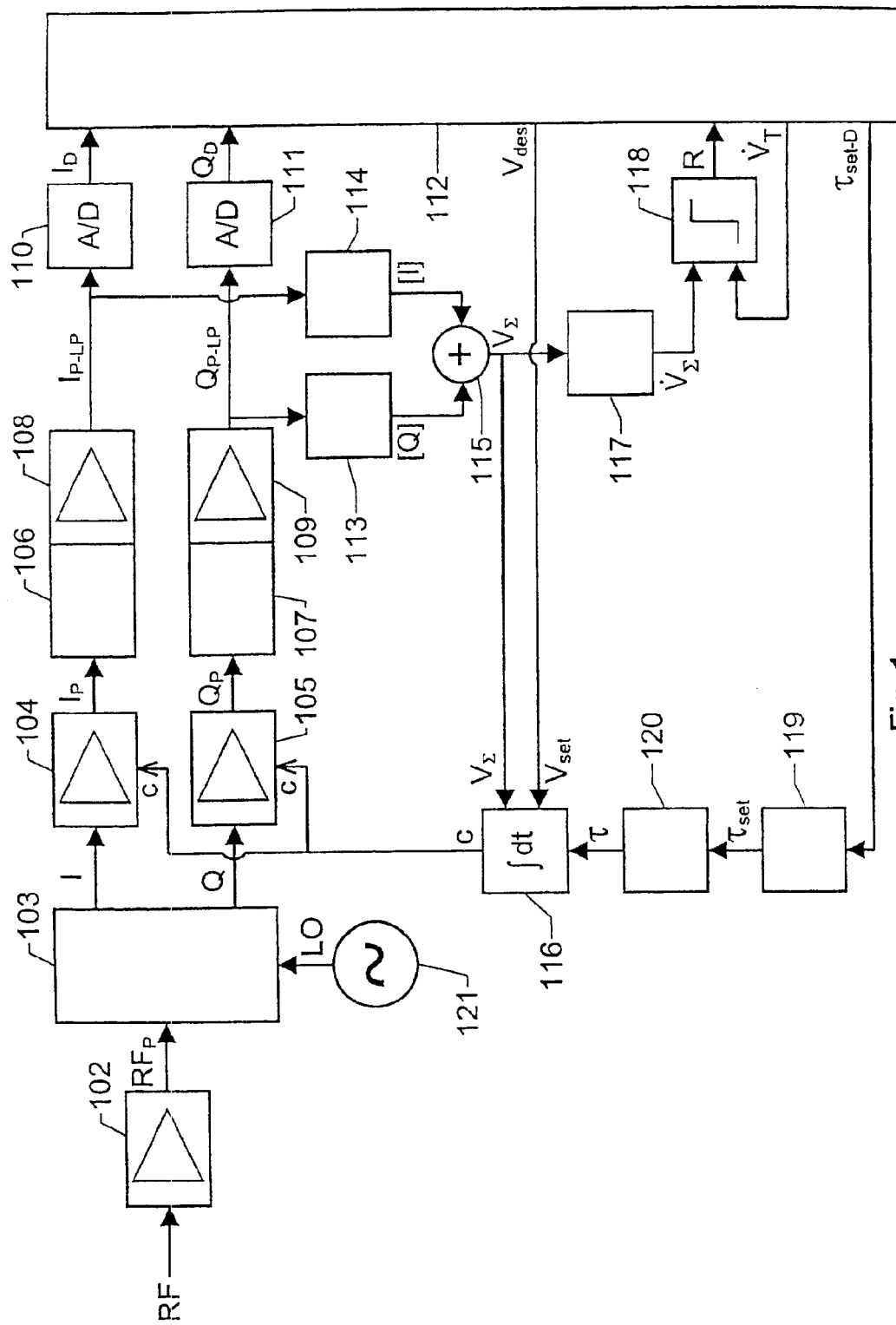
FIG. 1 shows a block diagram over an arrangement according to an embodiment of the invention.

FIG. 1 shows a block diagram over a receiver arrangement, which comprises a gain control loop according to an embodiment of the invention. The arrangement includes at least one radio frequency amplifier 102 for receiving radio frequency signals RF and producing corresponding amplified signals $RF_P$. A down converter 103 generates down converted signals I and Q from the amplified radio frequency signals $RF_P$. According to a preferred embodiment of the invention, the down converter 103 produces two quadrature signal components I and Q respectively by multiplying the amplified signal $RF_P$ with a reference frequency LO from a local oscillator 121 respective with a phase shifted version of the reference frequency LO.

The quadrature signal components I and Q are passed to a set of amplifiers 104; 105, whose gain is controllable in response to an automatic gain control signal c and which generate corresponding amplified signal components $I_P$ and $Q_P$. According to a preferred embodiment of the invention the amplified signal components $I_P$ and $Q_P$ are also filtered and further amplified in subsequent low pass filters 106; 107 and amplifiers 108; 109 respectively. As a result, filtered and amplified signals $I_{P-LP}$; $Q_{P-LP}$ are created, which represent information contained in the received radio frequency signals RF. The signals $I_{P-LP}$; $Q_{P-LP}$ are received by respective A/D-converters 110; 111 where they are converted into a digital format $I_D$; $Q_D$ for further processing in a digital signal processor 112.

Nevertheless, the filtered and amplified signals $I_{P-LP}$; $Q_{P-LP}$ are also included in the gain control loop and thus fed back to indirectly control the gain of the amplifiers 104; 105. A first signal level detector 113 receives a first signal component $Q_{P-LP}$ and produces in response thereto a first signal level [Q] representing the level or envelop of the first signal component $Q_{P-LP}$, i.e. a first order approximation. Naturally, any higher order of approximation of the signal [Q] may likewise be made, such as a second order power estimation. Correspondingly, a second signal level detector 114 receives a second signal component $I_{P-LP}$ and produces a second signal level [I] representing the level or envelop of the second signal component $I_{P-LP}$.

A combiner 115 receives both the first and the second signal level [Q]; [I] and generates a combined signal $V_\Sigma$, which represents the sum of the signal levels [Q] and [I]. The combined signal $V_\Sigma$ is passed on to a gain control signal generator 116 that produces an automatic gain control signal c on basis of i.a. the combined signal $V_\Sigma$.

The gain control signal generator 116 may include an integrator, which influences a time constant $\tau$ of the automatic gain control signal c in response to time properties of the combined signal $V_\Sigma$, such that a quickly varying combined signal $V_\Sigma$ results in a comparatively short time constant $\tau$, and vice versa, a slowly varying combined signal $V_\Sigma$ results in a comparatively long time constant $\tau$. During search for a radio frequency signal RF to receive or at other instances when a message is expected, the gain control signal generator 116 allocates a comparatively low value to the time constant $\tau$ (i.e. a short time constant $\tau$). Otherwise, the gain control signal generator 116 sets a time constant $\tau$ value that is adapted to an actual power variation rate of the received radio frequency signals RF. More generally, the gain control signal generator 116 is adapted for varying the time constant $\tau$ in response to a time derivative parameter of the at least one down converted signal, i.e. $I_{P-LP}$ or $Q_{P-LP}$, which describes a power variation rate of the received radio frequency signals RF. Naturally, this does not preclude that the time constant may be varied on basis of arbitrary additional parameters, which for instance, depend on the protocol and frame structure according to which the particular receiver operates.

On basis of a suitable input level of the first and second signal components $I_{P-LP}$ and $Q_{P-LP}$ to the dynamic range of the A/D-converters 110 and 111, the digital signal processor 112 produces a desired value $V_{des}$ of the combined signal $V_\Sigma$. This value $V_{des}$ is also fed to the gain control signal generator 116 to influence the automatic gain control signal c.

The automatic gain control signal c is fed in parallel to both the amplifiers 104 and 105 where it controls the gain, i.e. the amplification factor. The automatic gain control signal c is repeatedly updated to a value that is expected to make the amplifiers 104 and 105 respective 108 and 109 deliver the down converted signals at levels [I]; [Q] sufficiently close to a desired signal level. In practice, this also means that the automatic gain control signal c influences the amplifiers 104, 105,108 and 109 to deliver the down converted signals at levels [I]; [Q] less than a predetermined limit level. Preferably, the predetermined limit level is also optimised with respect to the dynamic range of the A/D-converters 110 and 111.

A derivation unit 117 also receives the combined signal $V_\Sigma$. This unit produces a time derivative parameter $\dot{V}_\Sigma$ by estimating a time derivative of the combined signal $V_\Sigma$, for instance by high pass filtering the combined signal $V_\Sigma$. The time derivative parameter $\dot{V}_\Sigma$ is received in a ramp detector 118, for instance a comparator, together with a threshold value $\dot{V}_T$ from the digital signal processor 112. If the time derivative parameter $\dot{V}_\Sigma$ exceeds the threshold value $\dot{V}_T$, the comparator 118 generates a pulse signal R. The digital signal processor 112 receives the pulse signal R and interprets the presence of the pulse signal R as an indication of a message start in the received radio frequency signals RF. The pulse signal R is activated i.a. when the RF power level rises sufficiently quickly from a relatively low, or even zero/noise floor level, to a relatively high level. By default, the time constant $\tau$ here has a comparatively low value and receiver is therefore well prepared for receiving the incoming message.

In an alternative embodiment of the invention, one or both of the derivation unit 117 and the ramp detector 118 are realised by functions within the digital signal processor 112.

In either case, after receiving the pulse signal R, the digital signal processor 112 computes a relevant starting value for the time constant $\tau$ (i.e. a short value) and delivers a corresponding digital value $\tau_{set-D}$ on an output. This value $\tau_{set-D}$ is forwarded to a conversion unit 119 being adapted to the digital signal format used. The conversion unit 119 creates a corresponding analogue parameter $\tau_{set}$. Hence, the unit 119 may be a conventional D/A-converter, a low pass filter or a pulse generator depending on the resolution requirements and the format of the digital signal $\tau_{set-D}$. If necessary, a following time constant generator 120 produces an actual time constant $\tau$ on basis of the analogue parameter $\tau_{set}$, for instance, by means of a table look-up in a bank of stored time constant values $\tau$.

During reception of a message (e.g. a data packet) the signal level of the received radio frequency signals RF should only vary to small extent. The automatic gain control signal c should namely have calibrated the gain of the amplifiers 104 and 105 to this signal level, such that the time derivative parameter $\dot{V}_\tau$ is approximately zero, or at least below the threshold value $\dot{V}_T$. Consequently, the pulse signal R should now be inactive. If, nevertheless, the digital signal processor 112 registers a pulse signal R during reception of a message, this is interpreted as an indication of an erroneous setting of the controllable gain in the amplifiers 104 and 105. Of course, this can in turn be a consequence of an external fact, such as a radical change in the radio environment. In any case, the affected message will normally be damaged or lost and will thus probably have to be re-transmitted.

This could imply that the receiver enters a search mode, in which a relevant portion of the radio frequency spectrum is scanned for possible radio frequency signals RF to receive. Alternatively, the receiver resets one or more of its parameters and attempts to re-establish the message reception. In any case, the digital signal processor 112 allocates a comparatively short time constant $\tau_{set-D}$.

The pulse signal R in turn constitutes a basis for the time constant value $\tau_{set-D}$. The pulse signal R history, and indirectly the threshold value $\dot{V}_T$ history, namely indicate that a particular stage in a typical message reception cycle has been reached. A short time constant value $\tau_{set-D}$ should always be applied in the beginning of the reception of a message. A large rise in the pulse signal R accompanied by a rise in the power level of the received radio frequency signals RF constitute indications of a message start and thus a short time constant value $\tau_{set-D}$ is likely to be successful.

A relatively long time constant value $\tau_{set-D}$ should be applied whenever the radio frequency signals RF are received at a relatively high and constant power level and if simultaneously the absence of a pulse signal R indicates that a message is currently being received. A long time constant value $\tau_{set-D}$ here means that the time constant value $\tau_{set-D}$ may also be infinitely long. The received radio frequency power level can be determined via the digital signals $I_D$; $Q_D$ and the value of the automatic gain control signal c. The value of the automatic gain control signal c can in turn be detected by the digital signal processor 112 via an A/D-converter (not shown).

A relatively short time constant value $\tau_{set-D}$ should be applied whenever no radio frequency signals RF are being received or in other situations when a new message is expected, for instance, in case of a message being lost or damaged. Consequently, based on variations in the power level of the received radio frequency signals RF and the pulse signal R, the digital signal processor 112 can allocate a adequate time constant value $\tau_{set-D}$ for the automatic gain control signal c. After having received a complete message, the digital signal processor 112 typically allocates a short time constant value $\tau_{set-D}$ and thus prepares the receiver for reception of a new message.

Figure 2:
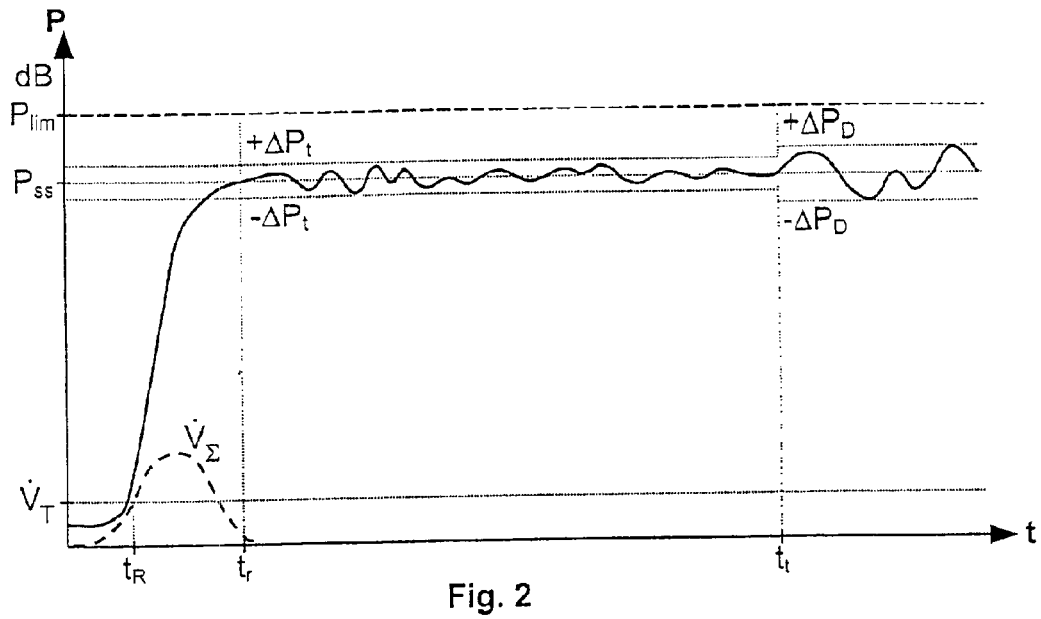
FIG. 2 illustrates a first aspect of the automatic gain control algorithm according to the invention by means of a power diagram.

FIG. 2 shows a power diagram that illustrates a first aspect of the automatic gain control algorithm. according to the invention. The horizontal axis represents time t and the vertical axis shows a transmitted/received signal power level in decibel. Naturally, the power values differ substantially depending on whether they reflect transmitted or received signal power. However, the interrelationship between the relevant levels and thresholds are substantially the same in both cases. A first power level $P_{SS}$ denotes the average signal level during transmission/reception of the payload information in the message. The transmitter should reach the level $P_{SS}$ at latest at a rise time $t_r$ after initiating the transmission and the receiver should reach its level $P_{SS}$ at a somewhat later time $t_t$ after that the transmission has been initiated. However, it is preferable if also the receiver has reached its level $P_{SS}$ already at the end of the rise time $t_r$. The period between the rise time $t_r$ and the time $t_t$ is namely utilised for calibrating certain units in the receiver, such as an equaliser. Thus, a so-called training sequence is typically sent between $t_r$ and $t_t$. The 802.11a-protocol specifies a relatively short rise time $t_r$ of 2 μs from initiating of the transmission. Since the receiver station cannot know when a transmission is in fact started, it uses a ramp detector, which here is illustrated by the threshold value $\dot{V}_T$ for the time derivative $\dot{V}_\Sigma$ of the combined signal $V_\Sigma$. Hence, the receiver station deduces that a new message is to be received whenever the time derivative $\dot{V}_\Sigma$ rises above the threshold value $\dot{V}_T$. The receiver station construes that it has detected a so-called signal power ramp, which starts at point in time $t_R$, when the threshold value $\dot{V}_T$ is exceeded. Provided that the rise time $t_r$ is a system parameter known by the receiver station (e.g. $t_r$=2 μs), the receiver station can expect the signal power ramp to end within a time period equal to the rise time $t_r$ after $t_R$.

When the rise time $t_r$ has come to an end, the power P of the radio frequency signal preferably levels out at the first power level $P_{SS}$. During the period from $t_r$ to $t_t$, when for instance training sequence is sent, the signal power level P typically shows a variation of $\pm\Delta P_t=3$ dB around the first power level $P_{SS}$ (i.e. peak-to-average (PAP)=3 dB). According to 802.11a $t_t$ is 8 μs and 802.11b $t_t$ stipulates a $t_t$ of 20-48 μs.

As of the time $t_t$ and onwards the radio frequency signals should have an average power P level close to the first power level $P_{SS}$ until the transmission is ended. The variation from this level is normally $\pm\Delta P_D=10$ dB (i.e. PAP=10 dB).

Even though the expected variation in power level P is lower between $t_r$ and $t_t$ than after $t_t$, it is generally preferable if the time constant τ of the automatic gain control signal c is shorter between $t_r$ and $t_t$ than after $t_t$. It is namely not desirable if the receiver "compensates" for the variations in the signal power after $t_t$, since such power variations may represent payload information in the message. Regardless of the time constant, the automatic gain control signal c should always have a value such that a down converted signal level is maintained below a limit level. This level is illustrated by means of a corresponding power value $P_{lim}$ in the diagram.

Figure 3:
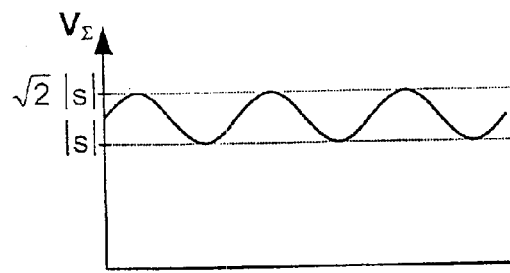
FIG. 3 shows a diagram over a combined signal on which an automatic gain control is based according to an embodiment of the invention.

FIG. 3 shows a diagram over an exemplary combined signal $V_\Sigma$ on which an automatic gain control c may be based according to an embodiment of the invention. The horizontal axis represents time t and the vertical axis shows the combined signal level $V_\Sigma$, for instance in volts. The FIG. 1 shows an embodiment of the invention where the combined signal $V_\Sigma$ contains a sum of the signal levels [Q]; [I] of a first down converted signal component Q and a second down converted signal component I. If the down converted signal is a sine wave with a constant amplitude |s| the combined signal level $V_\Sigma$ will then vary between $\sqrt{2}|s|$ and |s| also when the received signal level is constant. Consequently, a certain degree of variation in the combined signal level $V_\Sigma$ must be tolerated without activation of the ramp detector 118. Of course, an alternative level detection and/or signal combination may be performed, which results in a smaller "undesired" variation in the combined signal level $V_\Sigma$. It is, nevertheless, still preferable that a moderate variation (i.e. non-zero time derivative) in the combined signal level $V_\Sigma$ be accepted.

Figure 4:
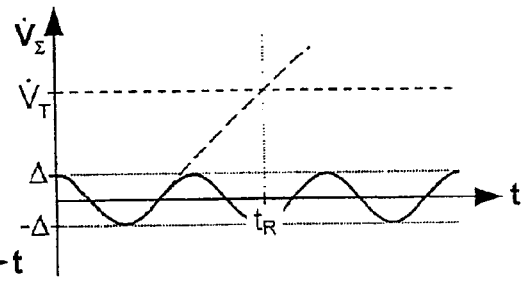
FIG. 4 shows a diagram over a time derivative parameter on which the automatic gain control may also be based according to an embodiment of the invention.

FIG. 4 shows a diagram over an exemplary time derivative parameter $\dot{V}_\Sigma$ according to an embodiment of the invention. Provided that the combined signal $V_\Sigma$ is produced according to the design in FIG. 1 and that the down converted signal is a sine wave with a constant amplitude, the time derivative parameter $\dot{V}_\Sigma$ will also vary to some extent, for instance between a highest value Δ and a lowest value −Δ. In order not to generate a pulse signal R (or alter the time constant τ) in response to these variations, the threshold value $\dot{V}_T$ must lie sufficiently above Δ to also exclude variations due to the down converted signal being a non-sine wave signal or a signal composed of more than one sine wave. A pulse signal R should only be generated when the RF power level rises relatively quickly. However, as soon as the derivative parameter $\dot{V}_\Sigma$ exceeds the threshold value $\dot{V}_T$, here at $t=t_R$, the ramp detector 118 produces a pulse signal R.

Figure 5:
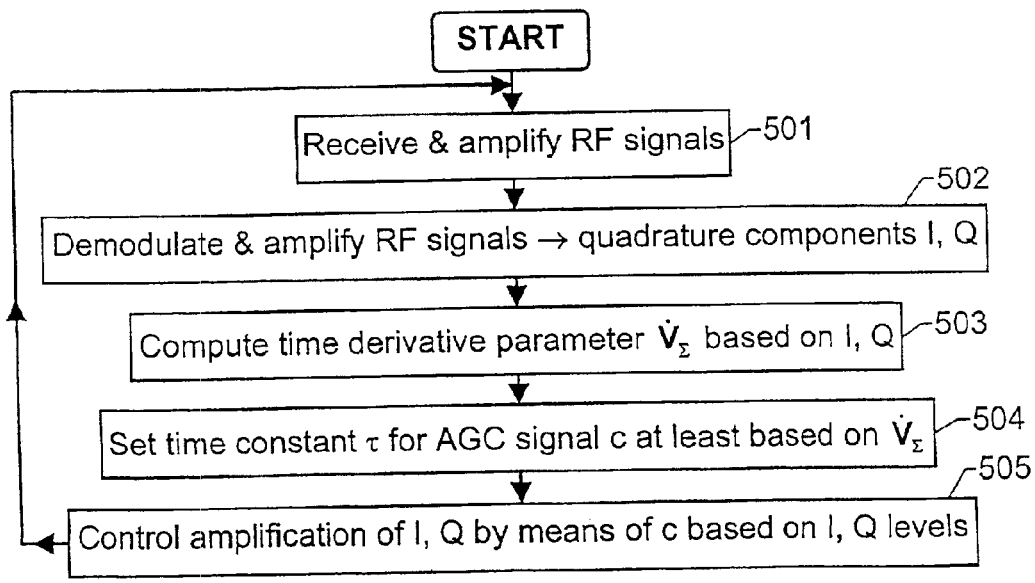
FIG. 5 illustrates, by means of a flow diagram, an embodiment of the method according to the invention.

In order to sum up, a method for controlling gain of an amplifier for received radio signals in a radio receiver according to an embodiment of the invention will now be described with reference to a flow diagram in the FIG. 5. It should be borne in mind that even though the steps in the flow diagram are executed sequentially, this is merely true with respect to an infinitesimal fraction of a received signal. While, for instance a certain segment of the signal is being down converted, a somewhat later segment of the same signal is being received, and so on.

Radio frequency signals are received and amplified in a first step 501. A following step 502 down converts the signals into quadrature components, which are then amplified. Subsequently, a step 503 computes a time derivative parameter on basis of the quadrature components. A following step 504 determines an automatic gain control signal having a time constant value, which is based on the time derivative parameter computed in the step 503. Finally, the amplification of the quadrature components is controlled in a step 506, on basis of the automatic gain control signal, such that down converted signal components to be digitised are maintained at signal level less than a predetermined limit level.

All of the process steps, as well as any sub-sequence of steps, described with reference to the FIG. 5 above may be controlled by means of a computer program, such as a digital signal processor algorithm, being directly loadable into the internal memory of a general computer, a digital signal processor, a baseband processor or an ASIC (Application Specific Integrated Circuit), which includes appropriate software for controlling the necessary steps when the program is run on a computer/digital signal processor. The computer program can likewise be recorded onto arbitrary kind of computer readable medium.

The term "comprises/comprising" when used in this specification is taken to specify the presence of stated features, integers, steps or components. However, the term does not preclude the presence or addition of one or more additional features, integers, steps or components or groups thereof.

The invention is not restricted to the described embodiments in the figures, but may be varied freely within the scope of the claims.

What is claimed is:

1. A method for controlling gain of an amplifier for received radio signals in a radio receiver, the radio receiver having a controllable gain responsive to an automatic gain control signal, the method comprising:

amplifying the received radio frequency signals;

level detecting at least two down converted signals resulting from the amplified radio frequency signals; and generating the automatic gain control signal such that the controllable gain maintains at least two down converted signal levels at less than a predetermined limit level, wherein generating the automatic gain control signal comprises:

varying a time constant of the automatic gain control signal in response to a time derivative parameter of the at least two down converted signals such that the automatic gain control signal is adapted to a power variation rate of the received radio frequency signals, the time constant varied using a combination of the at least two down converted signal levels.

2. A method for controlling gain of an amplifier, comprising:

amplifying one or more received signals to produce one or more amplified signals;

generating a plurality of down converted signals using the one or more amplified signals;

amplifying the plurality of down converted signals based on a gain control signal; and varying a time constant of the gain control signal based on a time derivative parameter associated with the plurality of down convened signals by generating a plurality of signal levels based on the down converted signals, combining the plurality of signal levels, and using the combined signal levels to generate the gain control signal.

3. The method of claim 2, wherein varying the time constant of the gain control signal comprises:
allocating a relatively small value to the time constant if the time derivative parameter has a relatively high value, and
allocating a relatively large value to the time constant if the time derivative parameter has a relatively low value.

4. The method of claim 2, wherein varying the time constant of the gain control signal comprises:
generating a first signal level based on one of the down converted signals;
generating a second signal level based on another of the down converted signals;
combining the first and second signal levels to generate a combined signal; and
using the combined signal to generate the gain control signal.

5. The method of claim 4, further comprising:
estimating the time derivative parameter using the combined signal;
comparing the time derivative parameter with a threshold value; and
generating a pulse signal based on the comparison, the pulse signal identifying a message start in the received signals.

6. The method of claim 5, wherein generation of the pulse signal during receipt of a message indicates an erroneous setting of the gain control signal.

7. The method of claim 5, further comprising producing a time constant value using the pulse signal, the time constant value forming a basis for the time constant of the gain control signal.

8. The method of claim 7, further comprising updating the time constant value after a specific time period.

9. The method of claim 5, wherein the threshold value is based on a power level of the received signals.

10. The method of claim 2, further comprising:
filtering the plurality of down converted signals to produce a plurality of filtered down converted signals; and
amplifying the filtered down converted signals.

11. The method of claim 2, further comprising:
converting the plurality of down converted signals into digital data; and
processing the digital data to produce a desired value.

12. The method of claim 2, wherein the plurality of down converted signals comprise quadrature components of the one or more amplified signals.

13. The method of claim 2, wherein the time constant is further varied based on one or more parameters associated with at least one of a protocol and a frame structure used to receive the one or more signals.

14. A receiver, comprising:
at least one first amplifier operable to amplify one or more received signals;
a down converter operable to generate a plurality of down converted signals using the one or more amplified signals;
at least one second amplifier operable to amplify the plurality of down converted signals based on a gain control signal; and a gain control loop operable to vary a time constant of the gain control signal based on a time derivative parameter associated with the plurality of down converted signals by generating a plurality of signal levels based on the down converted signals, combining the plurality of signal levels, and using the combined signal levels to generate the gain control signal.

15. The receiver of claim 14, wherein the gain control loop comprises:
at least one signal level detector operable to receive the plurality of down converted signals and to produce the plurality of signal levels;
a combiner operable to combine the plurality of signal levels into a combined signal; and
a gain control signal generator operable to produce the gain control signal using the combined signal.

16. The receiver of claim 15, wherein the gain control signal generator is operable to vary the time constant of the gain control signal to compensate for power variation in the received signals.

17. The receiver of claim 15, wherein the gain control signal generator is operable to produce the gain control signal by:
allocating a relatively small value to the time constant if the time derivative parameter of the combined signal has a relatively high value; and
allocating a relatively large value to the time constant if the time derivative parameter of the combined signal has a relatively low value.

18. The receiver of claim 15, wherein the gain control signal generator comprises an integrator.

19. The receiver of claim 15, wherein the gain control loop further comprises:
a derivation unit operable to estimate a time derivative of the combined signal; and
a ramp detector operable to compare the time derivative with a threshold value and generate a pulse signal based on the comparison, the pulse signal identifying a message start in the received signals.

20. The receiver of claim 19, wherein:
the derivation unit comprises a high pass filter; and
the ramp detector comprises a comparator.

21. The receiver of claim 14, further comprising:
at least one filter operable to filter the plurality of down converted signals and produce a plurality of filtered down converted signals; and
at least one third amplifier operable to amplify the filtered down converted signals.

22. The receiver of claim 14, further comprising:
at least one analog-to-digital converter operable to convert the plurality of down converted signals into digital data; and
at least one processor operable to process the digital data.

23. The receiver of claim 22, wherein the processor is operable to determine a starting time constant and generate a digital time constant value based on the starting time constant; and
further comprising a conversion unit operable to convert the digital time constant value into an analog time constant value.

24. The receiver of claim 23, wherein the conversion unit comprises one of a digital-to-analog convener, a low pass filter, and a pulse generator.

25. The receiver of claim 23, further comprising a time constant generator operable to identify the time constant using the analog time constant value.

26. The receiver of claim 22, wherein the processor comprises a digital signal processor.

27. The receiver of claim 14, wherein the down converter comprises a quadrature demodulator and a frequency oscillator.

28. A computer readable medium, having a program recorded thereon, wherein the program is operable when executed to:

vary a time constant of a gain control signal based on a time derivative parameter associated with a plurality of down converted signals by generating a plurality of signal levels based on the down converted signals, combining the plurality of signal levels, and using the combined signal levels to generate the gain control signal;

wherein the plurality of down converted signals are generated using one or more amplified received signals, and the plurality of down converted signals are further amplified based on the gain control signal.

29. The computer readable medium of claim 28, wherein the program is operable to vary the time constant of the gain control signal by:

allocating a relatively small value to the time constant if the time derivative parameter has a relatively high value; and allocating a relatively large value to the time constant if the time derivative parameter has a relatively low value.

30. The computer readable medium of claim 28, wherein the program is operable to vary the time constant of the gain control signal using a combined signal, the combined signal representing a combination of a first signal level based on one of the down converted signals and a second signal level based on another of the down converted signals.

31. The computer readable medium of claim 30, wherein the program is further operable to:

estimate a time derivative of the combined signal;

compare the time derivative with a threshold value; and generate a pulse signal based on the comparison, the pulse signal identifying a message start in the received signals.

32. The computer readable medium of claim 31, wherein the program is further operable to produce a time constant value using the pulse signal, the time constant value forming a basis for the time constant of the gain control signal.

33. The computer readable medium of claim 28, wherein the program is further operable to:

filter the plurality of down converted signals to produce a plurality of filtered down converted signals; and amplify the filtered down converted signals.

34. The computer readable medium of claim 28, wherein the program is further operable to:

convert the plurality of down converted signals into digital data; and process the digital data.

35. A computer program loadable into the internal memory of a digital computer, comprising:

computer readable program code for varying a time constant of a gain control signal based on a time derivative parameter associated with a plurality of down converted signals by generating a plurality of signal levels based on the down converted signals, combining the plurality of signal levels, and using the combined signal levels to generate the gain control signal;

wherein the plurality of down convened signals are generated using one or more amplified received signals, and the plurality of down converted signals are further amplified based on the gain control signal.

36. The computer program of claim 35, wherein the computer readable program code for varying the time constant comprises:

computer readable program code for allocating a relatively small value to the time constant if the time derivative parameter of the combined signal has a relatively high value; and computer readable program code for allocating a relatively large value to the time constant if the time derivative parameter of the combined signal has a relatively low value.

37. The computer program of claim 35, wherein the computer readable program code for varying the time constant is operable to vary the time constant of the gain control signal using a combined signal, the combined signal representing a combination of a first signal level based on one of the down converted signals and a second signal level based on another of the down converted signals.

38. The computer program of claim 37, further comprising:

computer readable program code for estimating a time derivative of the combined signal;

computer readable program code for comparing the time derivative with a threshold value; and computer readable program code for generating a pulse signal based on the comparison, the pulse signal identifying a message start in the received signals.

39. The computer program of claim 38, further comprising computer readable program code for producing a time constant value using the pulse signal, the time constant value forming a basis for the time constant of the gain control signal.

40. The computer program of claim 35, further comprising:

computer readable program code for filtering the plurality of down converted signals to produce a plurality of filtered down converted signals; and computer readable program code for amplifying the filtered down converted signals.

41. The computer program of claim 35, further comprising:

computer readable program code for converting the plurality of down converted signals into digital data; and computer readable program code for processing the digital data.

* * * * *

UNITED STATES PATENT AND TRADEMARK OFFICE
CERTIFICATE OF CORRECTION

| | |
|---|---|
| PATENT NO. | : 7,082,291 B2 |
| APPLICATION NO. | : 10/076992 |
| DATED | : July 25, 2006 |
| INVENTOR(S) | : Christian Nystrom, Per Konradsson and Ari Grasbeck |

Page 1 of 1

It is certified that error appears in the above-identified patent and that said Letters Patent is hereby corrected as shown below:

Column 5, line 48, delete "$V_\tau$" and replace with -- $V_\Sigma$ --.

Signed and Sealed this

Ninth Day of January, 2007

JON W. DUDAS
*Director of the United States Patent and Trademark Office*